United States Patent
Midya et al.

(10) Patent No.: US 7,629,840 B2
(45) Date of Patent: Dec. 8, 2009

(54) DIGITAL PULSE WIDTH MODULATED FEEDBACK SYSTEM FOR A SWITCHING AMPLIFIER AND METHOD THEREFOR

(75) Inventors: Pallab Midya, Palatine, IL (US); Theresa Paulo, Schaumburg, IL (US); William J. Roeckner, Carpentersville, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 91 days.

(21) Appl. No.: 11/875,998

(22) Filed: Oct. 22, 2007

(65) Prior Publication Data

US 2009/0102549 A1    Apr. 23, 2009

(51) Int. Cl.
*H03F 3/38* (2006.01)
(52) U.S. Cl. ............... 330/10; 330/251; 330/207 A
(58) Field of Classification Search ............... 330/10, 330/251, 207 A
See application file for complete search history.

(56) References Cited

U.S. PATENT DOCUMENTS 5,909,153 A * 6/1999 Delano et al. ............ 332/107
6,118,336 A * 9/2000 Pullen et al. ............ 330/10
6,504,427 B2   1/2003 Midya et al.
6,803,816 B2 * 10/2004 Putzeys ..................... 330/10
6,922,100 B2   7/2005 Midya et al.
7,002,406 B2 * 2/2006 Risbo et al. ............... 330/10
7,057,456 B2   6/2006 Taura et al.
7,315,202 B2 * 1/2008 Tsuji ....................... 330/10
7,355,472 B2 * 4/2008 Kranz ...................... 330/10
7,456,685 B2 * 11/2008 Chen, Wei ................ 330/10
7,482,865 B2 * 1/2009 Kost et al. ................ 330/10

* cited by examiner

*Primary Examiner*—Patricia Nguyen
(74) *Attorney, Agent, or Firm*—Daniel D. Hill

(57) ABSTRACT

A switching amplifier includes a power stage, a low pass filter, a combining circuit, and a feedback correction circuit. The power stage has an input terminal and an output terminal. The low pass filter has an input terminal coupled to the output terminal of the power stage, and an output terminal for providing a filtered pulse width modulated signal. The combining circuit has a first input terminal coupled to the output terminal of the power stage, a second input terminal coupled to the output terminal of the low pass filter, and an output terminal. The feedback correction circuit has a first input terminal for receiving a reference pulse width modulated signal, a second input terminal coupled to the output terminal of the combining circuit, and an output terminal coupled to the input terminal of the power stage.

18 Claims, 3 Drawing Sheets

DIGITAL PULSE WIDTH MODULATED FEEDBACK SYSTEM FOR A SWITCHING AMPLIFIER AND METHOD THEREFOR

BACKGROUND

1. Field

This disclosure relates generally to amplifiers, and more specifically, to a digital pulse width modulated feedback system for a switching amplifier and method therefor.

2. Related Art

Digital audio switching power amplifiers are well known and widely used. Most digital audio switching power amplifiers are based on pulse width modulation (PWM). A PWM signal is presented to a switching amplifier that performs a level shifting function to translate the PWM signal to a digital PWM signal having significantly higher voltage levels. The audio fidelity of the switching power amplifier is influenced by nonidealities of the system. In the system, feedback from a switching power stage is used to provide a correction signal to remove, for example, power supply noise. However, the feedback may not correct for problems caused by components following the switching power stage, such as for example, a low pass filter (LPF) coupled between the switching power stage and a speaker load. A LPF may have a variable frequency response and nonlinearity. Also, there may be an interaction between the variable frequency response of the LPF and a variable speaker load impedance that adversely affects signal quality. Therefore, it would be desirable to have feedback from the LPF rather than from the power stage. However, there is a significant amount of delay in the LPF which makes providing agile feedback from the LPF difficult.

Therefore, what is needed is a feedback system that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
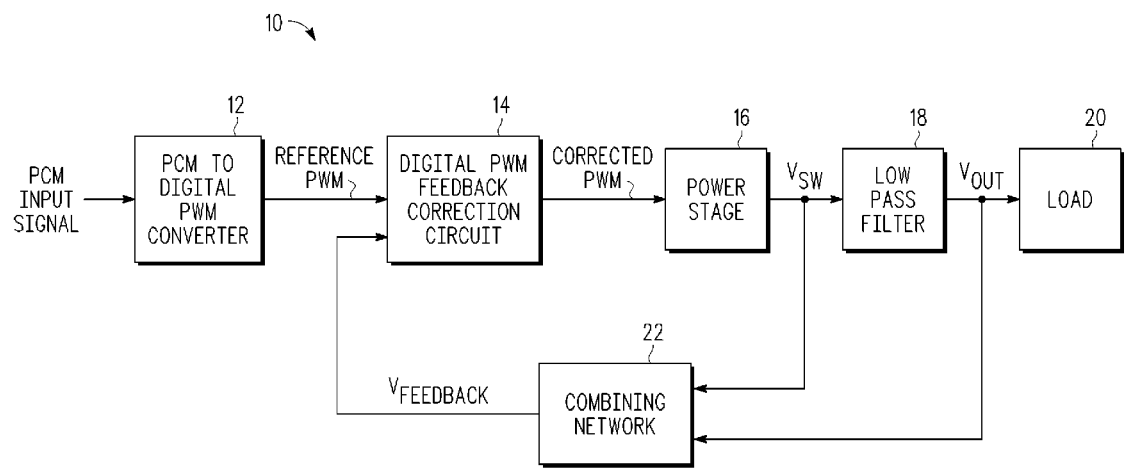
FIG. 1 illustrates, in block diagram form, a switching amplifier in accordance with an embodiment.

Generally, there is provided, a switching amplifier having a feedback correction circuit, a power stage, and a low pass filter (LPF). In one embodiment, a switching voltage from the power stage and an output voltage from the LPF are combined in a combining circuit and then fed back to the feedback correction circuit. One embodiment of the combining circuit is a combining RC (resistor-capacitor) network. In another embodiment, the feedback correction circuit includes two error amplifiers and a summation circuit to combine the switching voltage with the LPF output voltage. Combining the output of the LPF with the switching voltage allows the feedback correction circuit to remove nonidealities from both the power stage and the LPF.

In accordance with one aspect, there is provided, a switching amplifier comprising: a power stage having an input terminal and an output terminal; a low pass filter having an input terminal coupled to the output terminal of the power stage, and an output terminal for providing a filtered pulse width modulated signal; a combining circuit having a first input terminal coupled to the output terminal of the power stage, a second input terminal coupled to the output terminal of the low pass filter, and an output terminal; and a feedback correction circuit having a first input terminal for receiving a reference pulse width modulated signal, a second input terminal coupled to the output terminal of the combining circuit, and an output terminal coupled to the input terminal of the power stage.

In accordance with another aspect, there is provided, a switching amplifier comprising: a pulse code modulation (PCM) to pulse width modulation (PWM) converter having an input for receiving a PCM input signal and an output for providing a reference PWM signal; a feedback correction circuit having a first input for receiving the reference PWM signal, a second input for receiving a feedback signal, and an output for providing a corrected PWM signal; a power stage having an input coupled to the output of feedback correction circuit, and an output; a low pass filter having an input coupled to the output of the power stage, and an output for providing a filtered PWM signal; a load coupled to the output of the low pass filter; and a combining circuit having a first input coupled to the output of the power stage, a second input coupled to the output of the low pass filter, and an output for providing the feedback signal.

In accordance with yet another aspect, there is provided, a method for operating a switching amplifier, the method comprising: providing a correction circuit having first and second inputs and an output, a power stage having an input coupled to the output of the correction circuit, and a low pass filter having an input coupled to an output of the power stage and an output; receiving a reference pulse width modulated signal at the first input of the correction circuit; combining a first signal from the output of the power stage with a second signal from the output of the low pass filter to produce a feedback signal; providing the feedback signal to the second input of the correction circuit; determining a difference between the feedback signal and the reference pulse width modulated signal to produce a corrected pulse width modulated signal; amplifying the corrected pulse width modulated signal using the power stage to produce the first signal; and low pass filtering the first signal with the low pass filter to produce the second signal.

FIG. 1 illustrates, in block diagram form, a switching amplifier 10 in accordance with one embodiment. Switching amplifier 10 includes PCM (pulse code modulation)-to-digital PWM (pulse width modulation) converter 12, digital PWM feedback correction circuit 14, power stage 16, LPF 18, load 20, and combining network 22. PCM-to-PWM converter 12 has an input for receiving an input signal labeled "PCM INPUT SIGNAL", and an output for providing a reference PWM signal labeled "REFERENCE PWM". Digital PWM feedback correction circuit 14 has an input coupled to the output of the PCM-to-PWM converter 12 for receiving signal REFERENCE PWM, a second input coupled to an output of combining network 22 for receiving a feedback signal labeled "$V_{FEEDBACK}$", and an output for providing a signal labeled "CORRECTED PWM". Power stage 16 has an input coupled to the output of feedback correction circuit 14, and an output for providing an amplified signal labeled "$V_{SW}$". LPF 18 has an input coupled to the output of power stage 16, and an output for providing a signal labeled "$V_{OUT}$". Load 20 has an input coupled to the output of LPF 18. In one embodiment, load 20 is a speaker. Combining network 22 has a first input coupled to the output of power stage 16 for receiving signal $V_{SW}$, a second input coupled to the output of LPF 18 for receiving signal $V_{OUT}$, and an output coupled to the second input of feedback correction circuit 14 for providing feedback signal $V_{FEEDBACK}$.

The signal PCM INPUT SIGNAL is provided by a digital audio source. The switching amplifier may switch at a typical switching frequency of 375 kHz. In one embodiment, signal PCM INPUT SIGNAL is a music signal. A quantization clock (not shown in FIG. 1) may typically operate at 96 MHz. PCM-to-PWM converter 12 converts signal PCM INPUT SIGNAL to PWM signal REFERENCE PWM. The signal REFERENCE PWM can be digitally generated by counting edges of the quantization clock. The converter function may be implemented in software, in hardware, or a combination of software and hardware. Preferably, PCM-to-PWM converter 12 is implemented in the digital domain. Feedback correction circuit 14 receives the REFERENCE PWM signal and feedback signal $V_{FEEDBACK}$ which corrects errors in the signal. In one embodiment, the feedback correction circuit 14 is a conventional correction circuit implemented on an integrated circuit having an integrating error amplifier, an analog-to-digital converter (ADC), and a correction counter. A difference between the reference PWM signal and the feedback signal is an error signal. The error signal is amplified using the integrating error amplifier. In one embodiment, the integrating error amplifier is a multi-stage integrating error amplifier. The error signal from the integrating error amplifier is provided to the ADC where it is converted to a digital error signal. The digital error signal is used to generate the corrected signal in the digital domain. Power stage 16 amplifies, or level shifts, the CORRECTED PWM signal for driving load 20. Power stage 16 is a switching amplifier, and more specifically, a class D amplifier. LPF 18 functions to demodulate signal $V_{SW}$ to produce filtered signal $V_{OUT}$.

Figure 2:
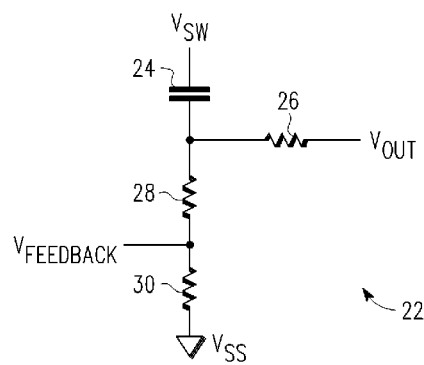
FIG. 2 illustrates, in schematic diagram form, one embodiment of the combining network of FIG. 1.
Figure 3:
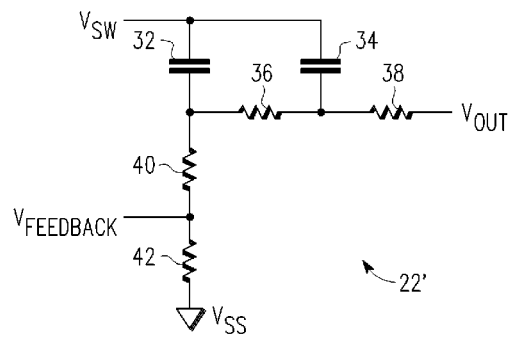
FIG. 3 illustrates, in schematic diagram form, another embodiment of the combining network of FIG. 1.
Figure 4:
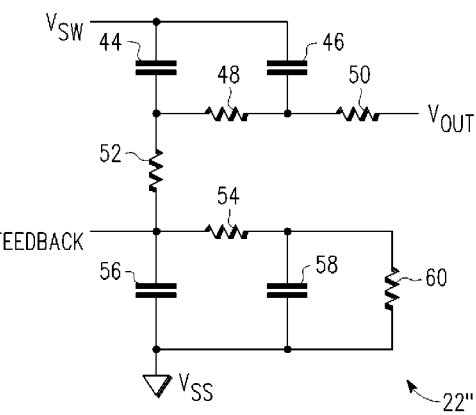
FIG. 4 illustrates, in schematic diagram form, yet another embodiment of the combining network of FIG. 1.

As mentioned above, nonidealities are generated by various parts of the circuit. For example, power supply noise may be introduced into the audio signal by power stage 16. In one embodiment, switching amplifier 10 may be used in a car audio system, where the car's battery provides the power supply voltage and is a major source of noise. Nonlinearity of the power stage degrades audio quality. Also, variable frequency response and nonlinearity of some LPFs and an interaction between the LPF and a variable speaker load impedance may reduce audio quality. The use of combining network 22 solves these problems by combining feedback signals from the output of power stage 16 ($V_{SW}$) and the output of LPF 18 ($V_{OUT}$) to produce a feedback signal $V_{FEEDBACK}$. Feedback signal $V_{FEEDBACK}$ is used by correction circuit 14 to remove errors generated in power stage 16 and LPF 18 to produce signal CORRECTED PWM. Generally, in the embodiment of FIG. 1, combining circuit 22 comprises an analog resistor-capacitor (RC) network for providing signal $V_{FEEDBACK}$ to the second input of the feedback correction circuit 14. FIG. 2, FIG. 3, and FIG. 4 each illustrate an embodiment of an analog RC network for providing feedback signal $V_{FEEDBACK}$. In the illustrated embodiment, the resistors and capacitors that make up the RC network are discrete elements having relatively large time constants to match the delay of LPF 18. In another embodiment, the resistors and capacitors may be implemented on an integrated circuit. However, using discrete elements may be easier and relatively more cost effective to change in some embodiments where various different low pass filters may be used.

FIG. 2 illustrates, in schematic diagram form, combining network 22 of FIG. 1 in accordance with one embodiment. Combining network 22 includes capacitor 24 and resistors 26, 28, and 30. Capacitor 24 has a first plate electrode coupled to the output of power stage 16 for receiving signal VSW, and a second plate electrode. Resistor 26 has a first terminal coupled to the second plate electrode of capacitor 24, and a second terminal coupled to the output of LPF 18 for receiving signal $V_{OUT}$. Resistor 28 has a first terminal coupled to the second plate electrode of capacitor 24, and a second terminal coupled to the second input of feedback correction circuit 14 for providing signal $V_{FEEDBACK}$. Resistor 30 has a first terminal coupled to the second terminal of resistor 28, and a second terminal coupled to a power supply voltage terminal labeled "$V_{SS}$".

In operation of combining circuit 22, for relatively low frequencies (for example audio frequencies), capacitor 24 is an open circuit and signal $V_{FEEDBACK}$ is proportional to $V_{OUT}$. That is, $V_{FEEDBACK}$ is equal to about $(V_{OUT} \times R_{30})/(R_{26}+R_{28}+R_{30})$, where $R_{26}$ is the resistance of resistor 26, $R_{28}$ is the resistance of resistor 28, and $R_{30}$ is the resistance of resistor 30. Conversely, at relatively high frequencies (higher than audio frequencies) capacitor 24 is a short circuit and $V_{FEEDBACK}$ is equal to about $(V_{SW} \times R_{30})/(R_{28}+R_{30})$. The $V_{FEEDBACK}$ signal is proportional to the switch voltage $V_{SW}$ at high frequencies which is not delayed. This maintains stability at high frequencies where the phase shift through the LPF is large. At audio frequencies where the phase shift through the LPF is small the $V_{FEEDBACK}$ signal is proportional to the output voltage $V_{OUT}$. Thus nonlinearities in the audio band are fed back and corrected by the feedback system.

FIG. 3 illustrates, in schematic diagram form, a combining network 22' for use in combining network 22 of the switching amplifier 10 of FIG. 1 in accordance with another embodiment. Combining network 22' includes capacitors 32 and 34 and resistors 36, 38, 40, and 42. In combining network 22', capacitor 32 has a first plate electrode coupled to the output of power stage 16 for receiving signal $V_{SW}$, and a second plate electrode. Capacitor 34 has a first plate electrode coupled to the output of power stage 16 for receiving signal $V_{SW}$, and a second plate electrode. Resistor 36 has a first terminal coupled to the second plate electrode of capacitor 32, and a second terminal coupled to the second plate electrode of capacitor 34. Resistor 38 has a first terminal coupled to the second plate electrode of capacitor 34, and a second terminal coupled to the output of LPF 18 for receiving signal $V_{OUT}$. Resistor 40 has a first terminal coupled to the second plate electrode of capacitor 32, and a second terminal coupled to the second input of feedback correction circuit 14 for providing $V_{FEEDBACK}$. Resistor 42 has a first terminal coupled to the second terminal of resistor 40, and a second terminal coupled to power supply voltage terminal $V_{SS}$.

FIG. 4 illustrates, in schematic diagram form, a combining network 22" for use in combining network 22 of the switching amplifier 10 of FIG. 1 in accordance with yet another embodiment. Combining network 22" includes capacitors 44, 46, 56, and 58, and resistors 48, 50, 52, 54, and 60. Capacitor 44 has a first plate electrode coupled to the output of power stage 16 for receiving signal $V_{SW}$, and a second plate electrode. Capacitor 46 has a first plate electrode coupled to the output of power stage 16 for receiving signal $V_{SW}$, and a second plate electrode. Resistor 48 has a first terminal coupled to the second plate electrode of capacitor 44, and a second terminal coupled to the second plate electrode of capacitor 46. Resistor 50 has a first terminal coupled to the second plate electrode of capacitor 46, and a second terminal coupled to the output of LPF 18 for receiving signal $V_{OUT}$. Resistor 52 has a first terminal coupled to the second plate electrode of capacitor 44, and a second terminal coupled to the second input of feedback correction circuit 14 for providing feedback signal $V_{FEEDBACK}$. Resistor 54 has a first terminal coupled to the second terminal of resistor 52, and a second terminal. Capacitor 56 has a first plate electrode coupled to the second terminal of resistor 52, and a second plate electrode coupled to power supply voltage $V_{SS}$. Capacitor 58 has first plate electrode coupled to the second terminal of resistor 54, and a second plate electrode coupled to $V_{SS}$. Resistor 60 has first terminal coupled to the second terminal of resistor 54, and a second terminal coupled to $V_{SS}$.

An analysis of combining network 22' shows that signal $V_{FEEDBACK}$ is a combination of $V_{OUT}$ and $V_{SW}$ as indicated in the following equation:

$$V_{Feedback} = \frac{V_{SW}\left\{\frac{R_{42}}{R_{40}+R_{42}}\left[\frac{s^2 C_{32}C_{34}R_{36}R_{38}+}{s(C_{32}R_{38}+C_{32}R_{36}+C_{34}R_{38})}\right]\right\} + Vout\left(\frac{R_{42}}{R_{40}+R_{42}}\right)}{s^2 C_{32}C_{34}R_{36}R_{38}+s\left(C_{32}R_{38}+C_{32}R_{36}+C_{34}R_{38}+\frac{C_{34}R_{36}R_{38}}{R_{40}+R_{42}}\right)+\frac{R_{36}+R_{38}}{R_{40}+R_{42}}+1}$$

where R with a subscript represents the resistance value of the corresponding resistor having the reference number in the subscript, and C with a subscript represents the capacitance value of the corresponding capacitor having the reference number in the subscript. The term 's' is the complex frequency and the equation above is in the 's' domain.

The networks 22' and 22" represent second order versions of the circuit in 22. A second order version further separates the $V_{SW}$ and $V_{OUT}$ terms for generating $V_{FEEDBACK}$ based on frequency. Having a larger number of passive components adds complexity but provides better frequency domain performance.

Figure 5:
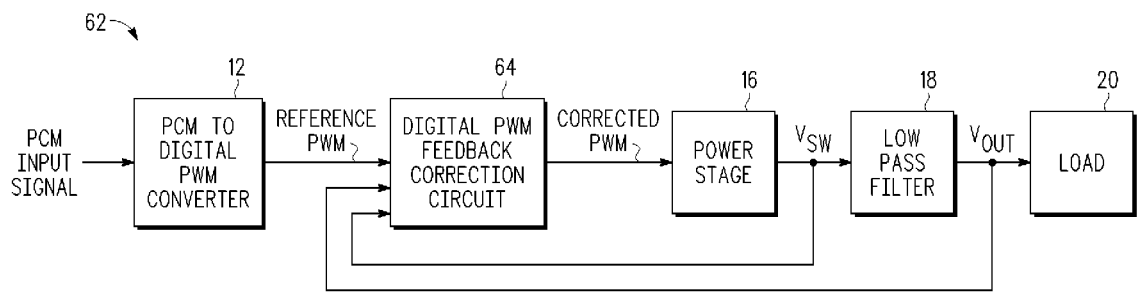
FIG. 5 illustrates, in block diagram form, a switching amplifier in accordance with another embodiment.

FIG. 5 illustrates, in block diagram form, a switching amplifier 62 in accordance with another embodiment. The same reference number is used for the same or similar circuit blocks in the embodiments of FIG. 1 and FIG. 5. Switching amplifier 62 includes PCM to digital PWM converter 12, digital PWM feedback correction circuit 64, power stage 16, LPF 18, and load 20. PCM-to-PWM converter 12 has an input for receiving an input signal labeled "PCM INPUT SIGNAL", and an output for providing a reference PWM signal labeled "REFERENCE PWM". Digital PWM feedback correction circuit 64 has a first input coupled to the output of the PCM-to-PWM converter 12 for receiving signal REFERENCE PWM, a second input coupled to an output of LPF 18 for receiving feedback signal labeled $V_{OUT}$, a third input coupled to the output of power stage 16 for receiving feedback signal VSW, and an output for providing a signal labeled "CORRECTED PWM". Power stage 16 has an input coupled to the output of feedback correction circuit 64, and an output for providing an amplified signal labeled "$V_{SW}$". LPF 18 has an input coupled to the output of power stage 16, and an output for providing feedback signal $V_{OUT}$. Load 20 has an input coupled to the output of LPF 18. In one embodiment, load 20 is a speaker.

Feedback correction circuit 64 differs from feedback correction circuit 14 in that the combining network is included in feedback correction circuit 64 and can be more easily implemented on an integrated circuit. The signal PCM INPUT SIGNAL is provided by a digital audio source. In one embodiment, signal PCM INPUT SIGNAL is a music signal. A system clock (not shown in FIG. 1) typically operates at 96 MHz. PCM-to-PWM converter 12 converts signal PCM INPUT SIGNAL to PWM signal REFERENCE PWM. The converter function may be implemented in software, in hardware, or a combination of software and hardware. Preferably, PCM-to-PWM converter 12 is implemented using a digital-signal-processor (DSP). Feedback correction circuit 64 receives feedback signals $V_{OUT}$ and $V_{SW}$ and corrects errors in the audio signal introduced by, for example, the power supply or LPF 18.

Figure 6:
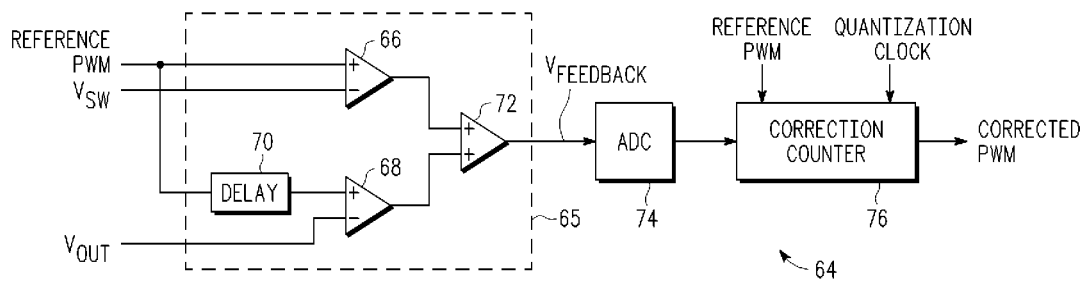
FIG. 6 illustrates, in block diagram form, one embodiment of the digital PWM feedback system of FIG. 5.

FIG. 6 illustrates, in block diagram form, one embodiment of the digital PWM feedback system 64 of FIG. 5 in more detail. Feedback correction circuit 64 includes combining network 65, analog-to-digital converter (ADC) 74, and correction counter 76. Combining network 65 includes error amplifiers 66 and 68, delay element 70, and summation circuit 72. Error amplifier 66 has a first input for receiving signal REFERENCE PWM from PCM to digital PWM converter 12, a second input for receiving signal $V_{SW}$, and an output. Delay element 70 has an input for receiving signal REFERENCE PWM, and an output. Error amplifier 68 has a first input coupled to the output of delay element 70, a second input for receiving signal $V_{OUT}$, and an output. Summation circuit 72 has a first input coupled to the output of error amplifier 66, a second input coupled to the output of error amplifier 68, and an output for providing a feedback signal $V_{FEEDBACK}$. ADC 74 has an input coupled to the output of summation circuit 72, and an output. Correction counter 76 has a first input coupled to the output of ADC 74, a second input for receiving signal REFERENCE PWM, a third input for receiving a quantization clock signal labeled "QUANTIZATION CLOCK", and an output for providing signal CORRECTED PWM.

Error amplifiers 66 and 68 are implemented as multi-stage integrating error amplifiers with a transfer function. Error amplifier 66 determines an amplified difference between the REFERENCE PWM signal and the $V_{SW}$ signal and provides the difference to the first input of summation circuit 72. Likewise, error amplifier 68 determines an amplified difference between a delayed REFERENCE PWM signal and the $V_{OUT}$ signal and provides the difference to the second input of summation circuit 72. The delay provided by the delay element is determined to match the delay in LPF 18. The combined and amplified differences from error amplifiers 66 and 68 becomes correction signal $V_{FEEDBACK}$. ADC 74 converts the analog signal VFEEDBACK to a digital correction signal. Correction counter 76 receives the digital correction signal from ADC 74. The clock signal QUANTIZATION CLOCK may typically have a frequency of 96 MHz and is used to generate the digital domain signal CORRECTED PWM. Power stage 16 amplifies, or level shifts, the CORRECTED PWM signal for driving load 20. Power stage 16 is a switching amplifier, and more specifically, a class D amplifier. LPF 18 functions to demodulate signal $V_{SW}$ to produce filtered, or demodulated, signal $V_{OUT}$.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, switching amplifier 10 may include any number of separate integrated circuits or separate devices interconnected with each other. Alternatively, in one embodiment, the illustrated elements of switching amplifier 10 are circuitry located on a single integrated circuit or within a same device. Also for example, switching amplifier 10 or portions thereof may be soft or code representations of physical circuitry or of logical representations convertible into physical circuitry. As such, switching amplifier 10 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A switching amplifier comprising:
   a power stage having an input terminal and an output terminal;
   a low pass filter having an input terminal coupled to the output terminal of the power stage, and an output terminal for providing a filtered pulse width modulated signal;
   a combining circuit having a first input terminal coupled to the output terminal of the power stage, a second input terminal coupled to the output terminal of the low pass filter, and an output terminal, the combining circuit comprising:
      a first capacitive element having a first plate electrode coupled to the output terminal of the power stage, and a second plate electrode;
      a first resistive element having a first terminal coupled to the second plate electrode of the first capacitive element, and a second terminal coupled to the output terminal of the low pass filter;
      a second resistive element having a first terminal coupled to the second plate electrode of the first capacitive element, and a second terminal coupled to the output terminal of the combining circuit; and
      a third resistive element having a first terminal coupled to the second terminal of the second resistive element, and a second terminal coupled to a power supply voltage terminal; and
   a digital feedback correction circuit having a first input terminal for receiving a reference pulse width modulated signal, a second input terminal coupled to the output terminal of the combining circuit, and an output terminal coupled to the input terminal of the power stage.

2. The switching amplifier of claim 1, wherein the first capacitive element and the first, second, and third resistive elements are each implemented as discrete elements.

3. The switching amplifier of claim 1, wherein the switching amplifier operates at audio frequencies.

4. The switching amplifier of claim 1, wherein the power stage is characterized as being a class D amplifier.

5. The switching amplifier of claim 1, wherein the first capacitive element and the first, second, and third resistive elements are implemented as passive components.

6. A switching amplifier comprising:
   a power stage having an input terminal and an output terminal;
   a low pass filter having an input terminal coupled to the output terminal of the power stage, and an output terminal for providing a filtered pulse width modulated signal;
   a combining circuit having a first input terminal coupled to the output terminal of the power stage, a second input terminal coupled to the output terminal of the low pass filter, and an output terminal, the combining circuit comprising:

a first capacitive element having a first plate electrode coupled to the output terminal of the power stage, and a second plate electrode;

a second capacitive element having a first plate electrode coupled to the output terminal of the power stage, and a second plate electrode a first resistive element having a first terminal coupled to the second plate electrode of the first capacitive element, and a second terminal coupled to the second plate electrode of the second capacitive element;

a second resistive element having a first terminal coupled to the second plate electrode of the second capacitive element, and a second terminal coupled to the output terminal of the low pass filter;

a third resistive element having a first terminal coupled to the second plate electrode of the first capacitive element, and a second terminal coupled to the output terminal of the combining circuit;

a third capacitive element having a first plate electrode coupled the second terminal of the third resistive element, and a second plate electrode coupled to a power supply voltage terminal;

a fourth resistive element having a first terminal coupled to the second terminal of the third resistive element, and a second terminal;

a fourth capacitive element having a first plate electrode coupled to the second terminal of the fourth resistive element, and a second plate electrode coupled to the power supply voltage terminal; and a fifth resistive element having a first terminal coupled to the second terminal of the fourth resistive element, and a second terminal coupled to the power supply voltage terminal; and a digital feedback correction circuit having a first input terminal for receiving a reference pulse width modulated signal, a second input terminal coupled to the output terminal of the combining circuit, and an output terminal coupled to the input terminal of the power stage.

7. The switching amplifier of claim 6, further comprising a pulse code modulation to pulse width modulation converter for receiving a pulse code modulated input signal, and in response, providing the reference pulse width modulated signal.

8. The switching amplifier of claim 6, wherein the first, second, and third capacitive elements and the first, second, third, fourth, and fifth resistive elements are each implemented as discrete elements.

9. A switching amplifier comprising:

a pulse code modulation (PCM) to pulse width modulation (PWM) converter having an input for receiving a PCM input signal and an output for providing a reference PWM signal;

a digital feedback correction circuit having a first input for receiving the reference PWM signal, a second input for receiving a feedback signal, and an output for providing a corrected PWM signal;

a power stage having an input coupled to the output of the digital feedback correction circuit, and an output;

a low pass filter having an input coupled to the output of the power stage, and an output for providing a filtered PWM signal;

a load coupled to the output of the low pass filter; and a combining circuit having a first input coupled to the output of the power stage, a second input coupled to the output of the low pass filter, and an output for providing the feedback signal, the combining circuit comprising:

a first capacitive element having a first plate electrode coupled to the output terminal of the power stage, and a second plate electrode;

a second capacitive element having a first plate electrode coupled to the output of the power stage, and a second plate electrode a first resistive element having a first terminal coupled to the second plate electrode of the first capacitive element, and a second terminal coupled to the second plate electrode of the second capacitive element;

a second resistive element having a first terminal coupled to the second plate electrode of the second capacitive element, and a second terminal coupled to the output of the low pass filter;

a third resistive element having a first terminal coupled to the second plate electrode of the first capacitive element, and a second terminal coupled to the output of the combining circuit; and a fourth resistive element having a first terminal coupled to the second terminal of the third resistive element, and a second terminal coupled to a power supply voltage terminal.

10. The switching amplifier of claim 9, wherein the first and second capacitive elements and the first, second, third, and fourth resistive elements are each implemented as discrete elements.

11. The switching amplifier of claim 9, wherein the switching amplifier operates at audio frequencies.

12. The switching amplifier of claim 9, wherein the power stage is characterized as being a class D amplifier.

13. The switching amplifier of claim 9, wherein the first and second capacitive elements and the first, second, third, and fourth resistive elements are implemented as passive components.

14. A method for operating a switching amplifier, the method comprising:

providing a digital correction circuit having first and second inputs and an output, a power stage having an input coupled to the output of the correction circuit, and a low pass filter having an input coupled to an output of the power stage and an output;

receiving a reference pulse width modulated signal at the first input of the correction circuit;

integrating a first signal from the output of the power stage using a first error amplifier to produce a first correction signal;

integrating a second signal from the output of the low pass filter using a second error amplifier to produce a second correction signal;

summing the first correction signal with the second correction signal to produce a feedback signal;

providing the feedback signal to the second input of the digital correction circuit;

determining a difference between the feedback signal and the reference pulse width modulated signal to produce a corrected pulse width modulated signal;

amplifying the corrected pulse width modulated signal using the power stage to produce the first signal; and low pass filtering the first signal with the low pass filter to produce the second signal.

15. The method of claim 14, wherein amplifying the corrected pulse width modulated signal using the power stage further comprises amplifying the corrected pulse width modulated signal using a class D amplifier.

16. The method of claim 14, further comprising converting a pulse code modulation signal into the reference pulse width modulated signal.

17. The method of claim 14, wherein the switching amplifier operates at audio frequencies.

18. The method of claim 17, wherein determining a difference between the feedback signal and the reference pulse width modulated signal further comprises:

converting the feedback signal to a digital signal; and
quantizing the digital signal to produce the corrected pulse width modulated signal.

* * * * *